United States Patent
JangJian et al.

(10) Patent No.: US 10,868,063 B2
(45) Date of Patent: Dec. 15, 2020

(54) SURFACE TREATMENT FOR BSI IMAGE SENSORS

(71) Applicant: Taiwan Semiconductor Manufacturing Company, Ltd., Hsinchu (TW)

(72) Inventors: Shiu-Ko JangJian, Tainan (TW); Chin-Nan Wu, Tainan (TW); Chun Che Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 158 days.

(21) Appl. No.: 15/956,344

(22) Filed: Apr. 18, 2018

(65) Prior Publication Data

US 2018/0240830 A1    Aug. 23, 2018

Related U.S. Application Data

(62) Division of application No. 14/547,958, filed on Nov. 19, 2014, now Pat. No. 9,978,793, which is a division of application No. 13/728,176, filed on Dec. 27, 2012, now Pat. No. 8,907,385.

(51) Int. Cl.
*H01L 27/146* (2006.01)

(52) U.S. Cl.
CPC .... *H01L 27/14623* (2013.01); *H01L 27/1462* (2013.01); *H01L 27/1463* (2013.01); *H01L 27/1464* (2013.01); *H01L 27/14625* (2013.01); *H01L 27/14685* (2013.01); *H01L 27/14689* (2013.01)

(58) Field of Classification Search
CPC .................................................. H01L 27/14623
See application file for complete search history.

(56) References Cited

U.S. PATENT DOCUMENTS

| | | | |
|---|---|---|---|
| 4,196,438 A * | 4/1980 | Carlson ................ | C23C 16/505 136/255 |
| 6,131,422 A | 10/2000 | Skrippek et al. | |
| 7,952,096 B2 | 5/2011 | Rhodes | |
| 8,233,066 B2 | 7/2012 | Zheng et al. | |
| 8,318,529 B1 | 11/2012 | Mao et al. | |
| 8,810,700 B2 | 8/2014 | Wang et al. | |
| 2004/0031961 A1 | 2/2004 | Zhang et al. | |
| 2005/0045926 A1* | 3/2005 | Mouli ................ | H01L 27/14601 257/294 |
| 2009/0057734 A1 | 3/2009 | Misawa et al. | |
| 2009/0101910 A1 | 4/2009 | Zhang et al. | |
| 2010/0244173 A1* | 9/2010 | Wang ................ | H01L 27/14685 257/435 |
| 2011/0199518 A1 | 8/2011 | Zheng et al. | |

(Continued)

FOREIGN PATENT DOCUMENTS

| | | |
|---|---|---|
| CN | 101752394 A | 6/2010 |
| CN | 101814519 A | 8/2010 |

(Continued)

*Primary Examiner* — William A Harriston
(74) *Attorney, Agent, or Firm* — Slater Matsil, LLP

(57) ABSTRACT

A method comprises forming an image sensor adjacent to a first side of a substrate, thinning a second side of the substrate, performing a halogen treatment on the second side of the substrate and forming a backside illumination layer on the second side of the substrate.

20 Claims, 9 Drawing Sheets

(56) References Cited

U.S. PATENT DOCUMENTS

| | | |
|---|---|---|
| 2011/0227182 A1 | 9/2011 | Aoki |
| 2012/0019695 A1 | 1/2012 | Qian et al. |
| 2013/0105926 A1 | 5/2013 | Kao |
| 2014/0252521 A1* | 9/2014 | Kao .................... H01L 27/1462 |
| | | 257/432 |

FOREIGN PATENT DOCUMENTS

| | | |
|---|---|---|
| CN | 102164250 A | 8/2011 |
| CN | 102237386 A | 11/2011 |
| CN | 102347343 A | 2/2012 |
| KR | 20100030734 A | 3/2010 |
| TW | 201143415 A | 12/2011 |

* cited by examiner

SURFACE TREATMENT FOR BSI IMAGE SENSORS

This application is a divisional of U.S. patent application Ser. No. 14/547,958, entitled "Surface Treatment for BSI Image Sensors," filed on Nov. 19, 2014, now U.S. Pat. No. 9,978,793, which is a divisional of U.S. patent application Ser. No. 13/728,176, entitled "Surface Treatment for BSI Image Sensors," filed on Dec. 27, 2012, now U.S. Pat. No. 8,907,385, each application is incorporated herein by reference.

BACKGROUND

As technologies evolve, complementary metal-oxide semiconductor (CMOS) image sensors are gaining in popularity over traditional charged-coupled devices (CCDs) due to certain advantages inherent in the CMOS image sensors. In particular, a CMOS image sensor may have a high image acquisition rate, a lower operating voltage, lower power consumption and higher noise immunity. In addition, CMOS image sensors may be fabricated on the same high volume wafer processing lines as logic and memory devices. As a result, a CMOS image chip may comprise both image sensors and all the necessary logics such as amplifiers, A/D converters and the like.

CMOS image sensors are pixelated metal oxide semiconductors. A CMOS image sensor typically comprises an array of light sensitive picture elements (pixels), each of which may include transistors (switching transistor and reset transistor), capacitors, and a photo-sensitive element (e.g., a photo-diode). A CMOS image sensor utilizes light-sensitive CMOS circuitry to convert photons into electrons. The light-sensitive CMOS circuitry typically comprises a photo-diode formed in a silicon substrate. As the photo-diode is exposed to light, an electrical charge is induced in the photo-diode. Each pixel may generate electrons proportional to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene.

A CMOS image sensor may comprise a plurality of additional layers such as dielectric layers and interconnect metal layers formed on top of the substrate, wherein the interconnect layers are used to couple the photo diode with peripheral circuitry. The side having additional layers of the CMOS image sensor is commonly referred to as a front side, while the side having the substrate is referred to as a backside. Depending on the light path difference, CMOS image sensors can be further divided into two major categories, namely front-side illumination (FSI) image sensors and backside illumination (BSI) image sensors.

In a FSI image sensor, light from the subject scene is incident on the front side of the CMOS image sensor, passes through dielectric layers and interconnect layers, and finally falls on the photo diode. The additional layers (e.g., opaque and reflective metal layers) in the light path may limit the amount of light absorbed by the photo diode so as to reduce quantum efficiency. In contrast, there is no obstruction from additional layers (e.g., metal layers) in a BSI image sensor. Light is incident on the backside of the CMOS image sensor. As a result, light can strike the photo diode through a direct path. Such a direct path helps to increase the number of photons converted into electrons.

BSI image sensors may generate electrons in response to the light incident on the backside of a CMOS image sensor. However, unwanted current may be generated in the absence of illumination. This unwanted current is known as the dark current. Excessive dark current may cause image degradation.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a halogen surface treatment process for backside illuminated image sensors. The embodiments of the disclosure may also be applied, however, to a variety of image sensors. Hereinafter, various embodiments will be explained in detail with reference to the accompanying drawings.

Figure 1:
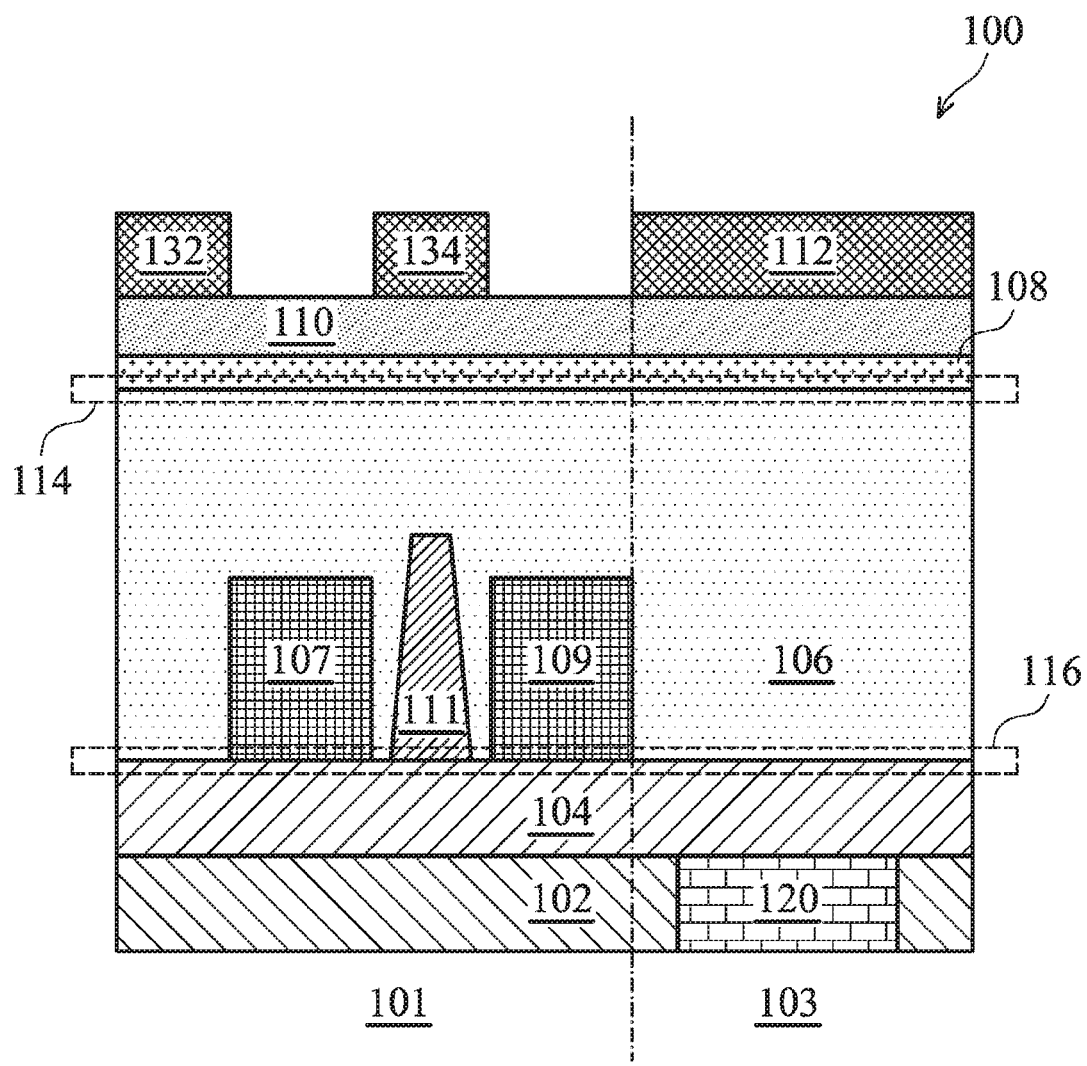
FIG. 1 illustrates a cross sectional view of a backside illumination image sensor in accordance with various embodiments of the present disclosure.

FIG. 1 illustrates a cross sectional view of a backside illumination image sensor in accordance with various embodiments of the present disclosure. The backside illumination image sensor 100 comprises an image sensor pixel array 101, a black level correction region 103 and other regions such as logic circuits, bonding pads and the like. For simplicity, the cross sectional view of the backside illumination image sensor 100 shown in FIG. 1 only illustrates a image sensor pixel array 101 and a black level correction region 103.

The image sensor pixel array 101 may comprise a plurality of photo diodes (e.g., photo diodes 107 and 109) formed adjacent to a first side of a semiconductor substrate 106. Two adjacent photo diodes 107 and 109 are separated from each other by an isolation region 111. The photo didoes 107 and 109 are used for generating electrical signals from the sensed light. As shown in FIG. 1, grids 132 and 134 are formed on a second side of the semiconductor substrate 106. The photo diodes (e.g., photo diode 107) are formed between two adjacent grids such as grids 132 and 134. In other words, two adjacent grids (e.g., grids 132 and 134) define a pixel region of the image sensor pixel array 101. The grids 132 and 134 may be formed of a variety of suitable materials such as, for example, tungsten, aluminum, copper, an alloy or a composite, any combinations thereof and/or the like.

It should be noted that for simplicity, hereinafter the side having additional layers (e.g., the first side) of the backside illuminated image sensor 100 is referred to as a front-side of the substrate 106, while the side having grids (e.g., grids 132 and 134) is referred to as a backside of the substrate 106.

The black level correction region 103 may comprise a black reference sensor (not shown), which is used for generating reference black level signals. As shown in FIG. 1, the black reference sensor located in the black level correction region 103 is shielded by a metal shielding layer 112. As a result, light does not strike the black reference sensor. Without receiving light, the black reference sensor can provide a black reference signal for the image sensor pixel array 101. Throughout the description, the black level correction region 103 is alternatively referred to as the metal shield region 103.

FIG. 1 further illustrates there may be a silicon halogen compound layer formed on the top surface of the substrate 106. More particularly, there may be a first silicon halogen compound layer 114 formed on a top surface of the backside of the substrate 106. Likewise, there may be a second silicon halogen compound layer 116 formed on a front-side surface of the substrate 106.

During the fabrication process of backside illumination image sensors, a plurality of dangling bonds may be generated on the top surfaces (e.g., backside and front-side) of the substrate. Such dangling bonds may cause problems such as noise, dark currents and/or the like. A silicon halogen compound layer helps to eliminate dangling bonds so that the key device characteristics such as noise and dark currents may be improved. The detailed fabrication process of the backside illumination image sensor 100 will be described below with respect to FIGS. 2-9.

Figure 2:
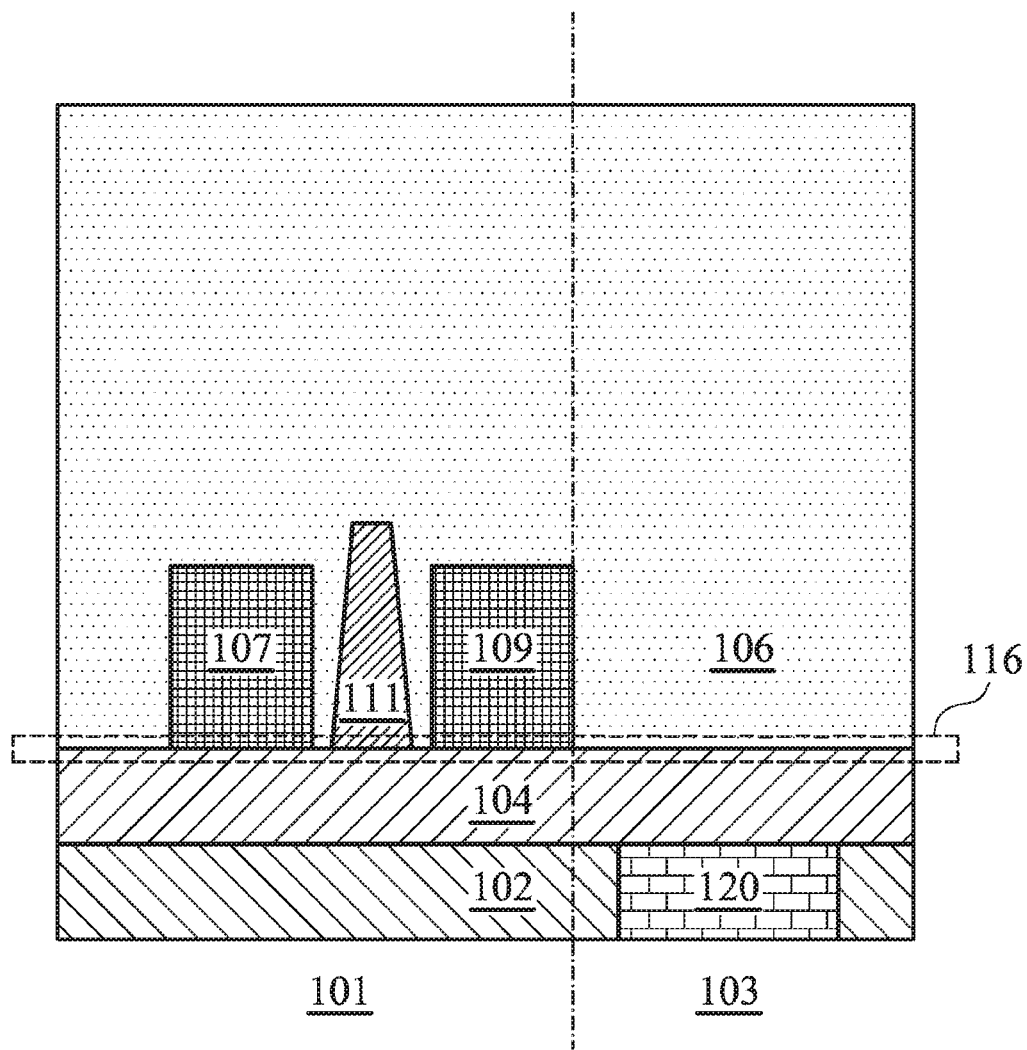
FIG. 2 illustrates a cross sectional view of a semiconductor substrate in accordance with various embodiments of the present disclosure.

FIGS. 2-9 illustrate intermediate steps of fabricating the backside illumination image sensor 100 shown in FIG. 1 in accordance with various embodiments of the present disclosure. FIG. 2 illustrates a cross sectional view of a semiconductor substrate in accordance with various embodiments of the present disclosure. The substrate 106 may be of a first conductivity. In accordance with an embodiment, the substrate 106 is a highly doped p-type substrate. The substrate 106 may be formed of silicon, germanium, silicon germanium, graded silicon germanium, semiconductor-on-insulator, carbon, quartz, sapphire, glass, or the like, and may be multi-layered (e.g., strained layers). A lightly doped p-type epitaxial layer (not shown) may be grown on the highly doped p-type substrate 106.

The substrate 106 may comprise a plurality of photo active regions. The photo active regions may comprise, for example, photo-diodes (e.g., photo active region 107) formed by implanting impurity ions into the epitaxial layer. Furthermore, the photo active regions may be a PN junction photo-diode, a PNP photo-transistor, an NPN photo-transistor and/or the like. In accordance with an embodiment, the photo active regions such as photo active region may comprise a p-type layer formed on an n-type region, wherein the n-type region is formed on an epitaxial layer grown from a p-type semiconductor substrate (e.g., highly doped p-type substrate 106).

In accordance with an embodiment, n-type impurity ions are implanted into the p-type epitaxial layer to form an n-type photo diode region (not shown). In addition, p-type impurity ions are implanted into the n-type photo diode region to form a p-type diode region (not shown). The n-type photo diode region and the p-type photo diode region further form a photo diode region (e.g., photo diodes 107 and 109).

The substrate 106 may comprise a plurality of pixels, each of which comprises a photo diode region (e.g., photo diode 107). In order to prevent crosstalk between adjacent pixels, an isolation region 111 is employed to separate two adjacent photo diodes. In accordance with some embodiments, the isolation region 111 may be a shallow trench isolation (STI) structure. The STI structure may be formed by etching a portion of the substrate 106 to form a trench and filling the trench with oxide and/or other dielectric materials.

A dielectric layer 104 is typically formed over the front-side of the substrate 106. In accordance with an embodiment, the dielectric layer 104 may be formed of low-K dielectric materials such as silicon oxide, borophosphosilicate glass (BPSG), phosphosilicate glass (PSG), fluorinated silicate glass (FSG), carbon-doped silicon oxide or the like. The dielectric layer 104 may be formed by any suitable techniques such as chemical vapor deposition (CVD) techniques or the like.

A metal interconnect layer 102 may be formed over the dielectric layer 104. The metal interconnect layer 102 may comprise a plurality of metal lines 120. The metal interconnect layer 102 can be patterned by plasma etching or a damascene process and may be formed of any conductive material suitable for the particular application. Materials that may be suitable include, for example, aluminum, copper, doped polysilicon or the like. Contacts and vias (not shown) may be formed to provide electrical connectivity between the metal interconnect layer 102 and underlying circuitry (not shown).

FIG. 2 further illustrates a silicon-halogen compound layer 116 may be formed on the front-side surface of the substrate 106. The process of generating the silicon-halogen compound layer 116 is the same as the process of generating the silicon-halogen compound layer 114 (not shown but illustrated in FIG. 1). The detailed process of generating a silicon halogen compound layer on the top surface of a substrate will be described below in detail with respect to FIG. 4.

Figure 3:
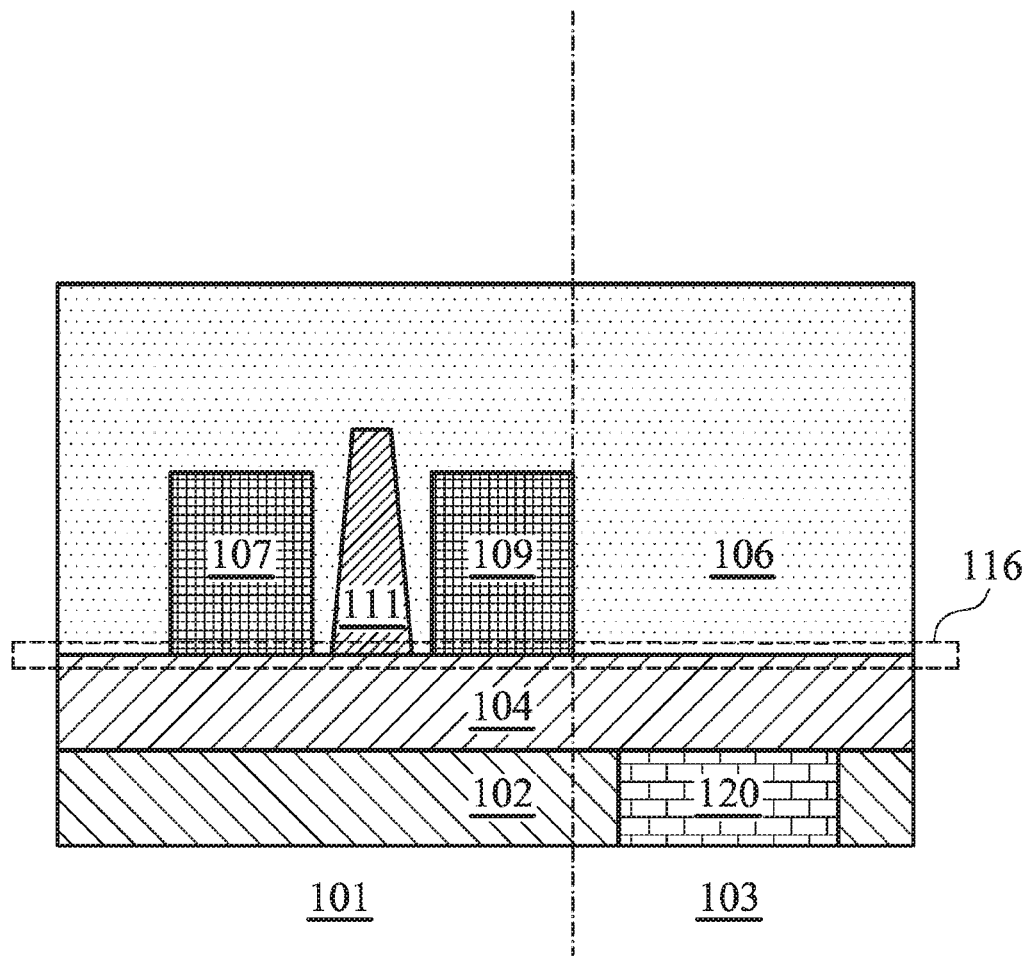
FIG. 3 is a cross sectional view of the semiconductor device illustrated in FIG. 2 after a thinning process has been applied to the backside of the substrate in accordance with various embodiments of the present disclosure.

FIG. 3 is a cross sectional view of the semiconductor device illustrated in FIG. 2 after a thinning process has been applied to the backside of the substrate in accordance with various embodiments of the present disclosure. The substrate 106 prior to a thinning process is of a thickness in a range from about 700 um to about 800 um. According to the fabrication processes of backside illuminated image sensors, the backside of the substrate 106 is thinned until the highly doped p-type substrate 106 is removed and the lightly doped p-type epitaxial layer is exposed.

In some embodiments, the backside of the substrate 106 of the backside illuminated image sensor 100 may be thinned to a thickness in a range from about 3 um to about 4 um. Such a thin substrate layer allows light to pass through the substrate and hit photo diodes (e.g., photo diodes 107 and 109) embedded in the substrate 106 without being absorbed by the substrate. The thinning process may be implemented by using suitable techniques such as grinding, polishing, chemical etching and/or the like.

Figure 4:
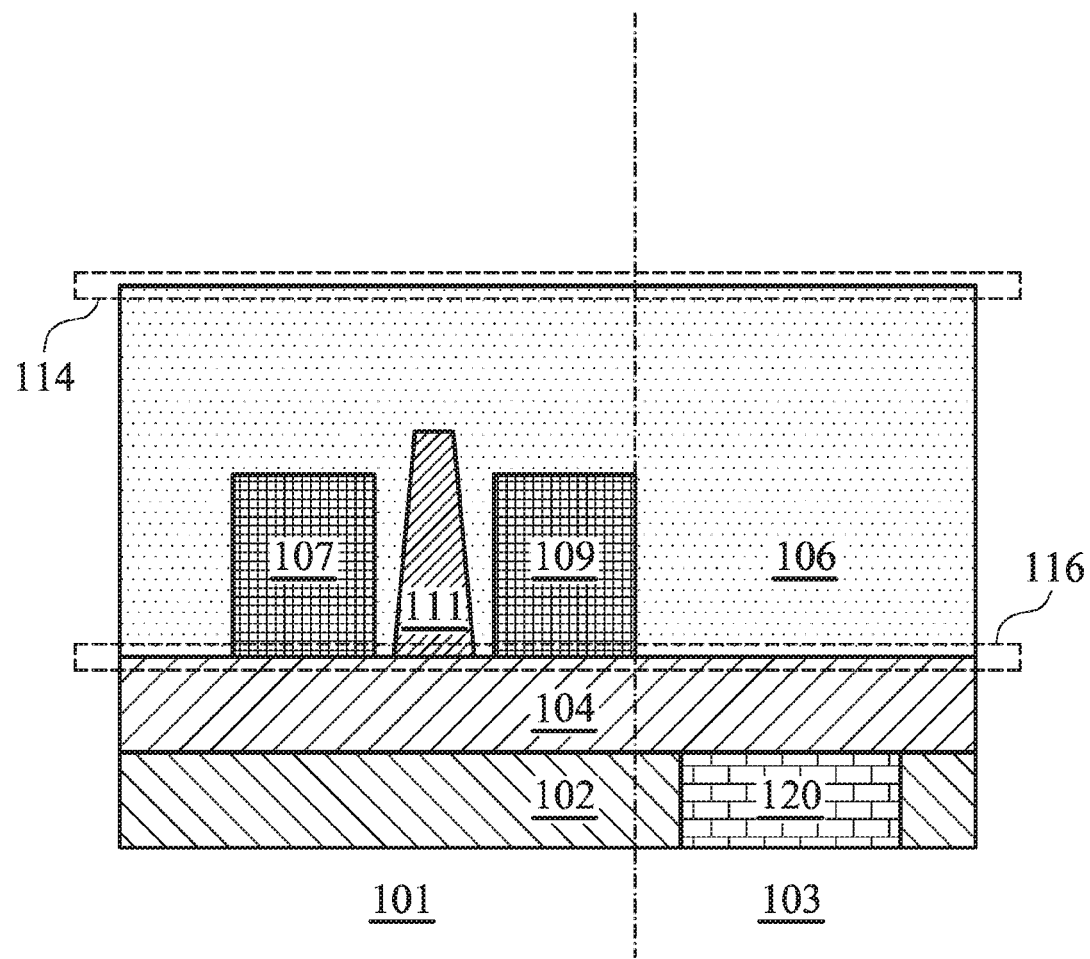
FIG. 4 is a cross sectional view of the semiconductor device illustrated in FIG. 3 after a halogen treatment process has been applied to the surface of the backside of the substrate in accordance with various embodiments of the present disclosure.

FIG. 4 is a cross sectional view of the semiconductor device illustrated in FIG. 3 after a halogen treatment process has been applied to the surface of the backside of the substrate in accordance with various embodiments of the present disclosure. In some embodiments, the halogen treatment process is implemented using a dry halogen treatment. In particular, the semiconductor device is placed in a chamber and a halogen gas flows over the surface of the backside of the semiconductor device. The halogen gas may comprise fluorine. Fluorine containing gas may react with the silicon surface of the semiconductor device to produce the silicon halogen compound layer 114.

The percentage of fluorine on the top surface of the backside of the substrate 106 is in a range from about 0.15% to about 0.5%. The temperature of the dry halogen treatment may be in a range from about 250 degrees to about 450 degrees.

It should be noted that the halogen gas may be replaced by a plasma enhanced process. The chamber may be configured to generate plasma using the gas in the chamber. During the plasma enhanced treatment, the dangling bonds on the top surface of the backside of the semiconductor devices are replaced by stronger bonds generated by the plasma enhanced treatment.

In alternative embodiments, the halogen treatment process is implemented using a wet halogen treatment. In particular, the backside surface of the semiconductor device is exposed to suitable fluorine containing acids such as hydrofluoric acid (HF) and the like. The fluorine containing acid may react with the silicon surface of the semiconductor device to produce the silicon halogen compound layer 114. The duration of the wet halogen treatment is in a range from about 10 seconds to about 20 seconds.

Figure 5:
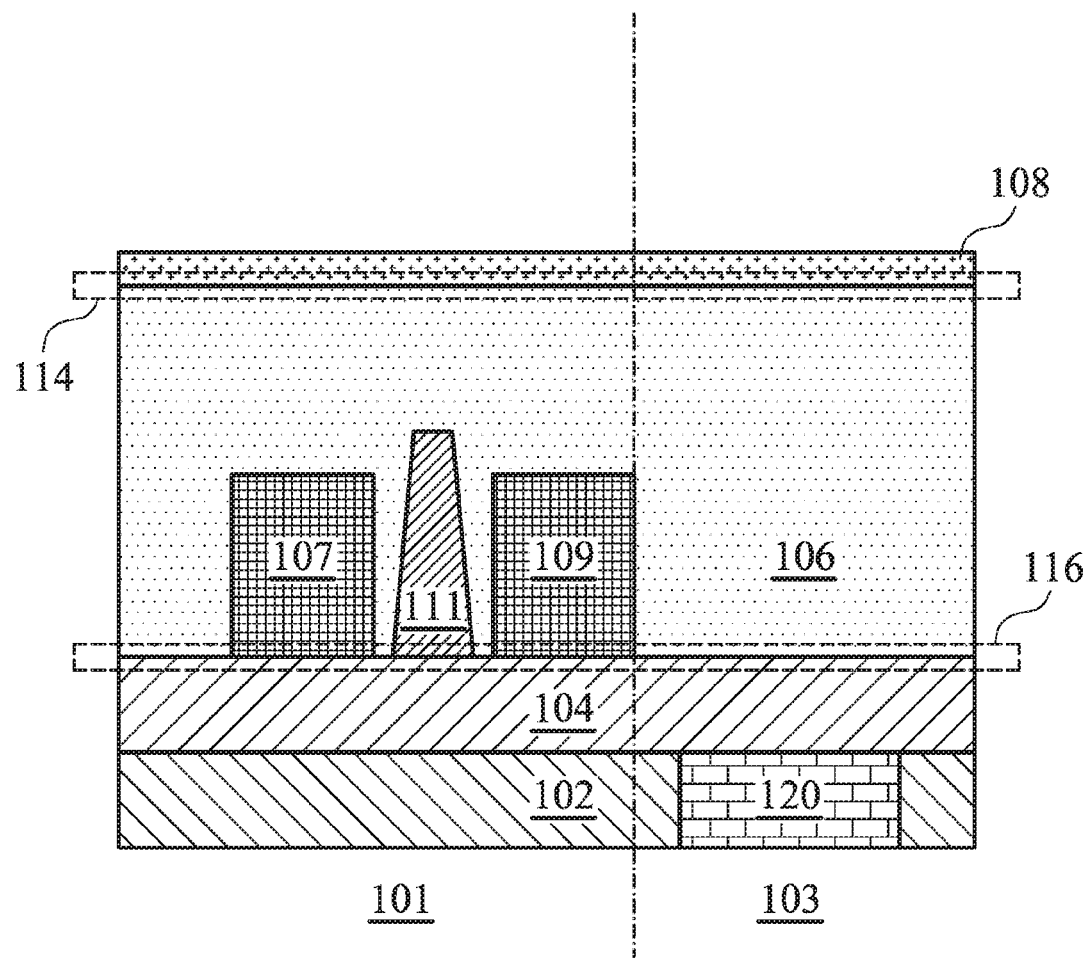
FIG. 5 is a cross sectional view of the semiconductor device illustrated in FIG. 4 after an anti-reflection coating (ARC) layer is deposited over the backside of the substrate in accordance with various embodiments of the present disclosure.

FIG. 5 is a cross sectional view of the semiconductor device illustrated in FIG. 4 after an anti-reflection coating (ARC) layer is deposited over the backside of the substrate in accordance with various embodiments of the present disclosure. Once the silicon halogen compound layer 114 is formed on the top surface of the backside of the substrate 106, the ARC layer 108 is formed over the backside of the substrate 106 subsequently.

The ARC layer 108 may be formed of a nitride material, an organic material, an oxide material and the like. The ARC layer 108 may be formed using suitable techniques such as CVD and the like.

Figure 6:
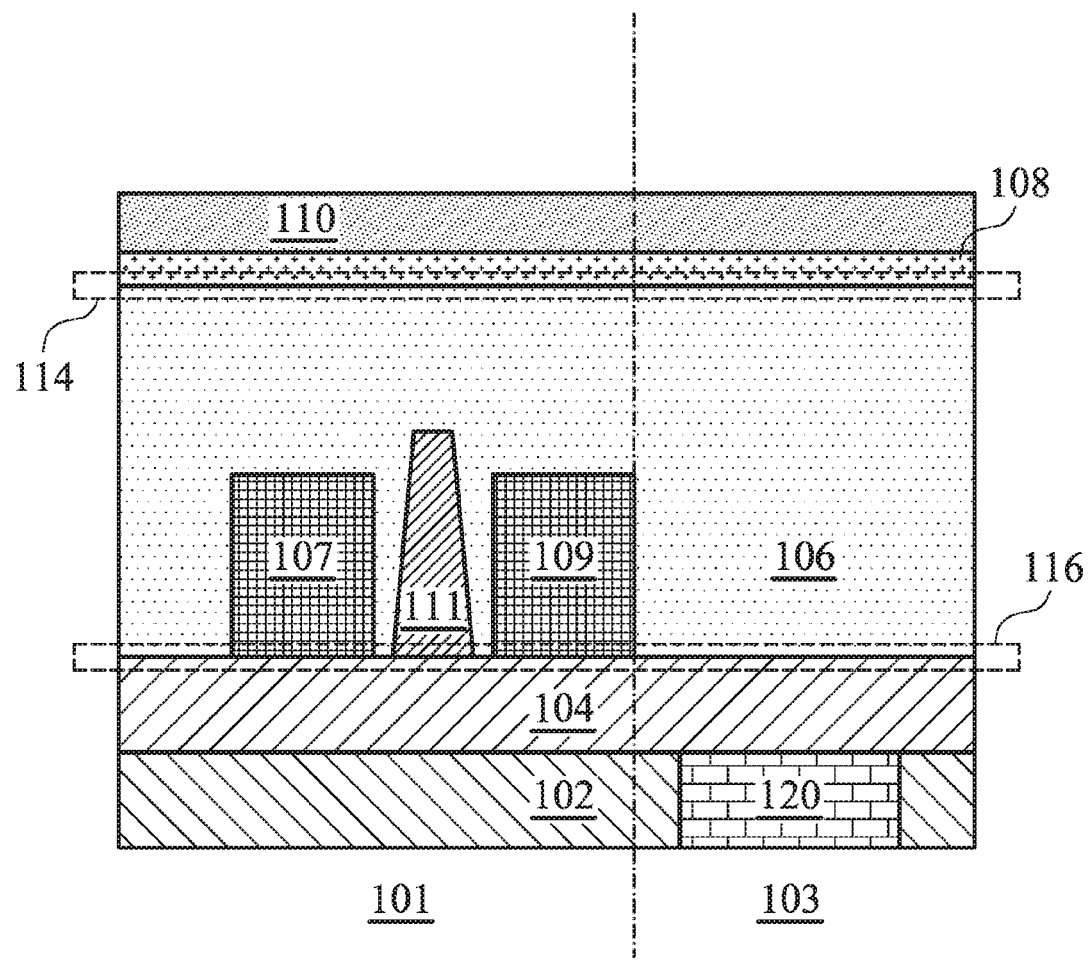
FIG. 6 is a cross sectional view of the semiconductor device illustrated in FIG. 5 after a dielectric layer is formed over the ARC layer in accordance with various embodiments of the present disclosure.

FIG. 6 is a cross sectional view of the semiconductor device illustrated in FIG. 5 after a dielectric layer is formed over the ARC layer in accordance with various embodiments of the present disclosure. The dielectric layer 110 may be formed of oxide. More particularly, the dielectric layer 110 may comprise a first oxide layer, a second oxide layer and a buffer oxide layer (not shown respectively).

In some embodiments, the first oxide layer is a plasma enhanced oxide (PEOX) having a thickness of about 1100 Angstroms. In some embodiments, the second oxide layer is a low deposited rate resistor protection oxide (LRPO) having a thickness of about 4200 Angstroms. In some embodiments, the buffer oxide layer is a plasma enhanced oxide (PEOX) having a thickness of about 500 Angstroms. As such, the dielectric layer 110 is of a collective thickness of about 5800 Angstroms. It should be noted that, throughout the description, the ARC layer 108 and the dielectric layer 110 may be collectively referred to as a backside illumination film.

Figure 7:
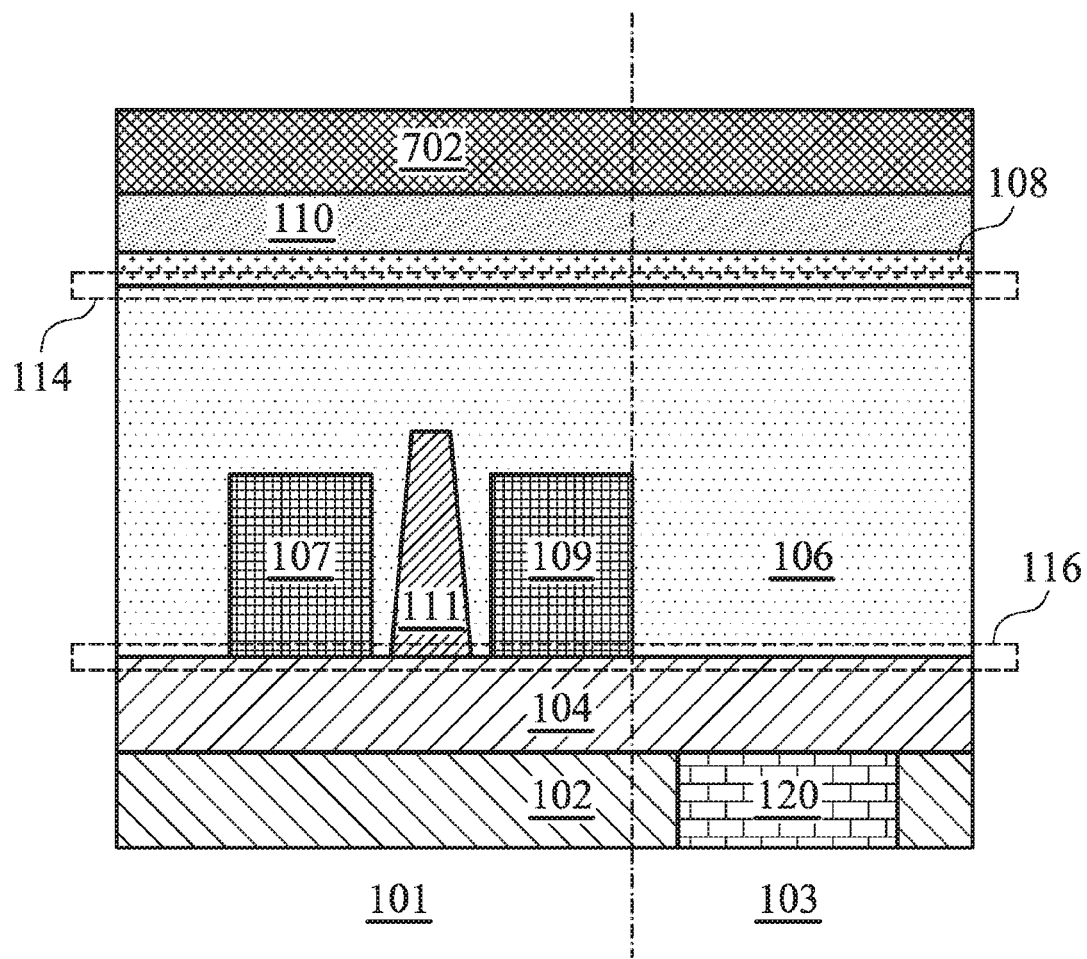
FIG. 7 illustrates a cross sectional view of the semiconductor device shown in FIG. 6 after a metal layer is deposited over the backside illumination film in accordance with various embodiments of the present disclosure.

FIG. 7 illustrates a cross sectional view of the semiconductor device shown in FIG. 6 after a metal layer is deposited over the backside illumination film in accordance with various embodiments of the present disclosure. The metal layer 702 is formed over the dielectric layer 110. In accordance with an embodiment, the metal materials deposited over the dielectric layer 110 include copper, aluminum, tantalum, titanium nitride, any combinations thereof and/or the like. In some embodiments, the metal layer 702 is of a thickness in a range from about 50 nm to about 200 nm.

In accordance with an embodiment, the metal materials may be deposited over the backside of the substrate 106 using a suitable deposition process such as CVD, plasma enhanced CVD (PECVD), atomic layer deposition (ALD), electroplating and/or the like.

Figure 8:
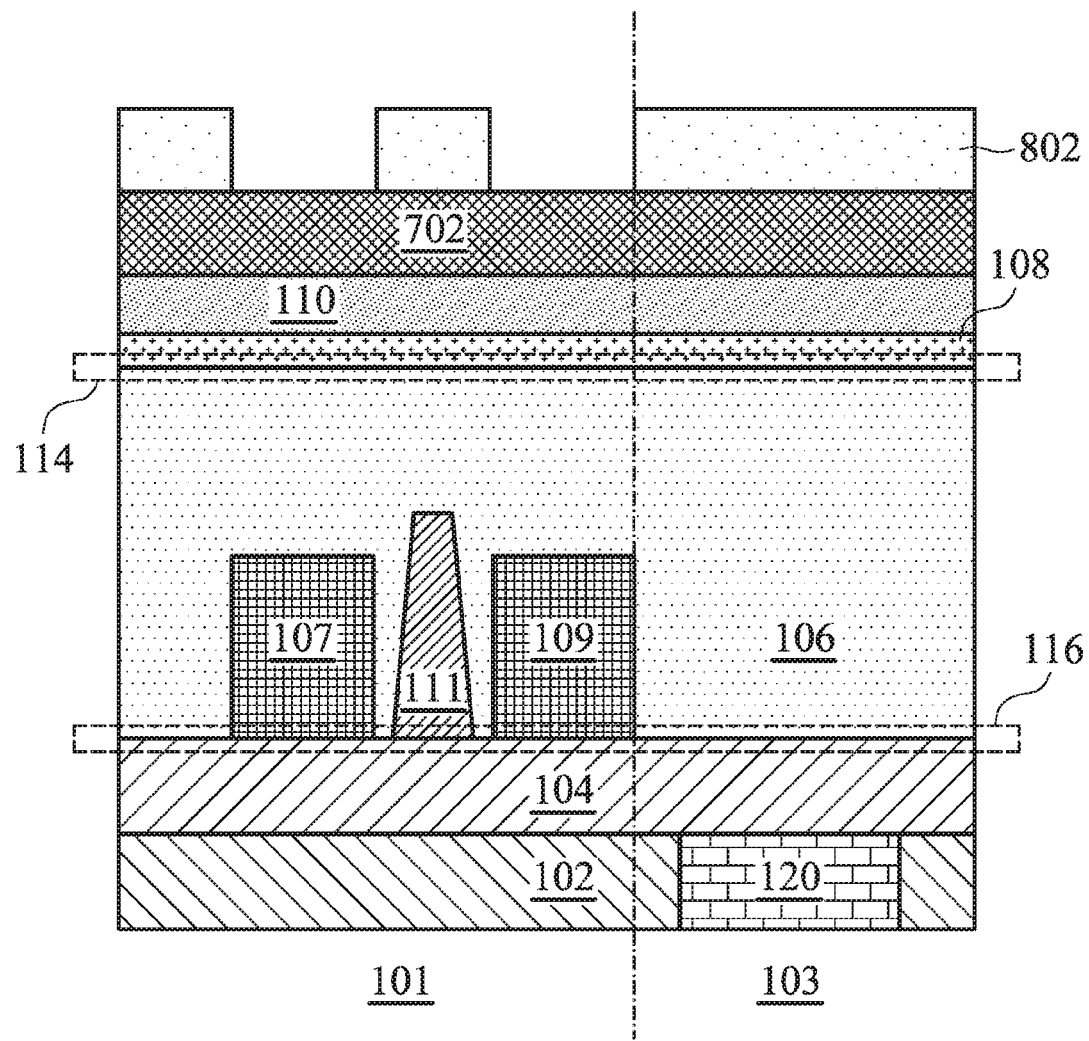
FIG. 8 illustrates a cross sectional view of the semiconductor device shown in FIG. 7 after a backside metal grid photolithography process is performed using a photo resist in accordance with various embodiments of the present disclosure.

FIG. 8 illustrates a cross sectional view of the semiconductor device shown in FIG. 7 after a backside metal grid photolithography process is performed using a photo resist in accordance with various embodiments of the present disclosure. A photoresist material is deposited on the metal layer 702 to form a photo resist layer 802. According to the location and shape of the grids and metal shielding layer shown in FIG. 1, portions of the photo resist layer 802 are exposed. The patterning process shown in FIG. 8 is well known, and hence is not discussed in further detail.

Figure 9:
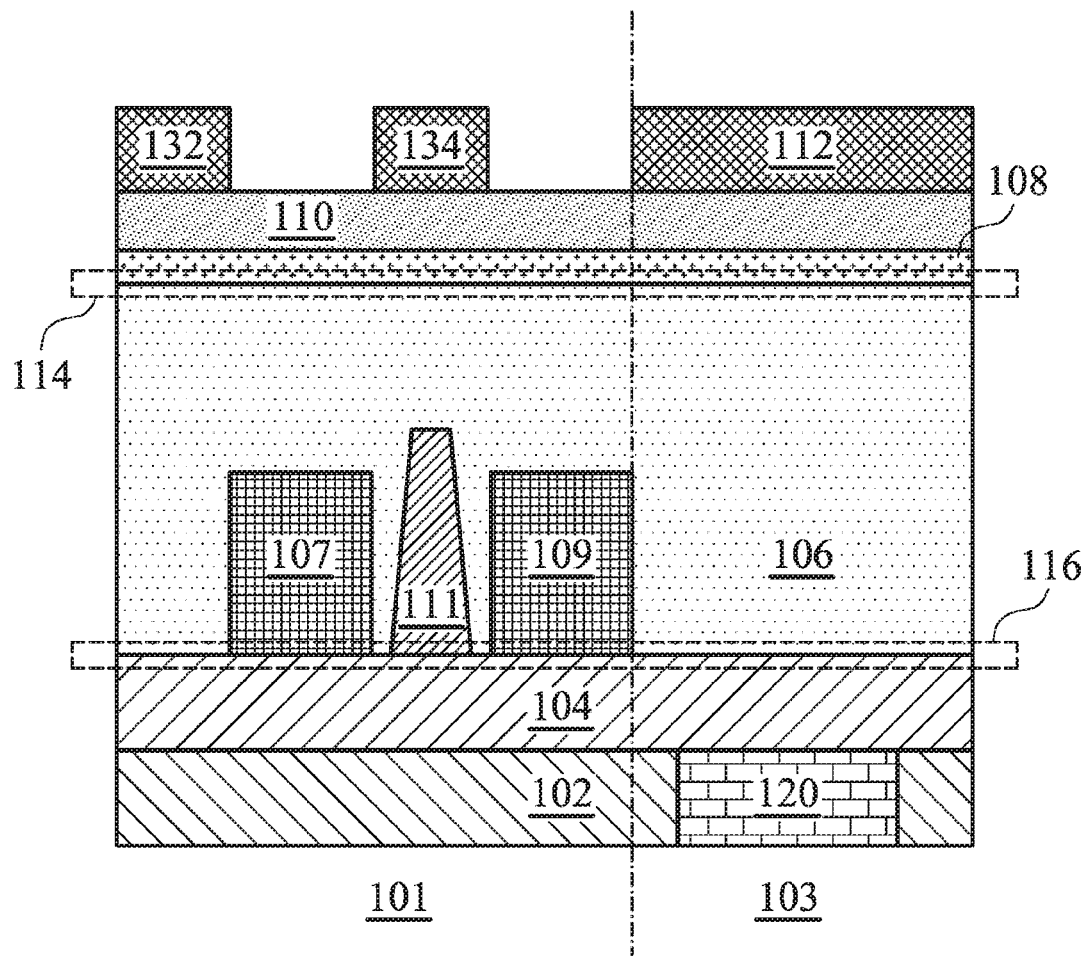
FIG. 9 illustrates a cross sectional view of the semiconductor device shown in FIG. 8 after an etching process is performed in accordance with various embodiments of the present disclosure.

FIG. 9 illustrates a cross sectional view of the semiconductor device shown in FIG. 8 after an etching process is performed in accordance with various embodiments of the present disclosure. An etching process, such as an anisotropic dry etch process, may be used to remove portions of the metal layer 702 to form the grids 132, 134 and the metal shielding layer 112.

In accordance with an embodiment, a method comprises implanting ions in a substrate to form a plurality of photo diodes, forming an interconnect layer over a first side of the substrate, thinning a second side of the substrate and applying a first halogen treatment process to a second side of the substrate and forming a first silicon-halogen compound layer over the second side of the substrate.

In accordance with another embodiment, a method comprises forming an image sensor adjacent to a first side of a substrate, thinning a second side of the substrate, performing a halogen treatment on the second side of the substrate and forming a backside illumination layer on the second side of the substrate.

In accordance with yet another embodiment, a method comprises forming a plurality of photo diodes in a substrate, forming an interconnect layer over a first side of the substrate, thinning a second side of the substrate, applying a first halogen treatment process to the first side of the substrate and forming a first silicon-halogen compound layer over the first side of the substrate and applying a second halogen treatment process to a second side of the substrate and forming a second silicon-halogen compound layer over the second side of the substrate.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    implanting ions in a substrate to form a plurality of photo diodes;
    forming an interconnect layer over a first side of the substrate;
    thinning a second side of the substrate, the second side being an opposite side of the substrate from the first side; and
    applying a first halogen treatment process to a second side of the substrate and forming a first silicon-halogen compound layer over the second side of the substrate.

2. The method of claim 1, further comprising:
    applying a second halogen treatment process to the first side of the substrate and forming a second silicon-halogen compound layer over the first side of the substrate.

3. The method of claim 2, wherein:
    the substrate comprises an image sensor region and a black level correction region, and wherein the black level correction region is shielded by a metal shielding layer deposited over the second side of the substrate, and wherein a sidewall of the metal shielding layer is vertically aligned with a sidewall of a photo diode.

4. The method of claim 3, further comprising:
    depositing an anti-reflection coating layer over the second side of the substrate; and
    depositing a dielectric layer over the anti-reflection coating layer, wherein the anti-reflection coating layer and the dielectric layer are between the metal shielding layer and the substrate.

5. The method of claim 3, further comprising:
    depositing a metal layer over the second side of the substrate;
    applying an etching process to the metal layer; and
    forming a metal shielding layer and a plurality of grids through patterning the metal layer.

6. The method of claim 1, wherein:
    two adjacent photo diodes are separated by an isolation region, and wherein a height of the isolation region is greater than a height of one of the two adjacent photo diodes.

7. The method of claim 1, wherein:
    after the step of thinning the second side of the substrate, the substrate is of a thickness in a range from about 3 micrometers to about 4 micrometers.

8. A method comprising:
    forming an image sensor adjacent to a first side of a substrate;
    thinning a second side of the substrate;
    after thinning the second side of the substrate, performing a halogen treatment on the second side of the substrate; and
    forming a backside illumination layer on the second side of the substrate.

9. The method of claim 8, wherein forming the backside illumination layer on the second side of the substrate includes:
    depositing an anti-reflection coating layer on the second side of the substrate; and
    depositing a dielectric layer on the anti-reflection coating layer.

10. The method of claim 8, further comprising:
    forming a metal layer over the backside illumination layer; and
    patterning the metal layer to form a metal shielding layer and a plurality of grids.

11. The method of claim 8, wherein forming the image sensor includes:
    growing an epitaxial layer on the substrate; and
    implanting ions in the epitaxial layer to form the image sensor.

12. The method of claim 11, wherein forming the image sensor further comprises:
    forming an isolation region in the epitaxial layer, and wherein a height of the isolation region is greater than a height of the image sensor.

13. The method of claim 11, wherein forming the image sensor further comprises:
    forming an n-type photo diode region of the image sensor by implanting n-type ions in the epitaxial layer; and
    forming a p-type photo diode region of the image sensor by implanting p-type ions in the epitaxial layer, wherein the n-type photo diode region and the p-type photo diode region form a photo diode region.

14. The method of claim 8, wherein:
    after the step of thinning the second side of the substrate, the substrate is of a thickness in a range from about 3 micrometers to about 4 micrometers.

15. A method comprising:
    forming a plurality of photo diodes in a substrate;
    forming an interconnect layer over a first side of the substrate;
    thinning a second side of the substrate;
    applying a first halogen treatment process to the first side of the substrate and forming a first silicon-halogen compound layer over the first side of the substrate; and
    applying a second halogen treatment process to a second side of the substrate and forming a second silicon-halogen compound layer over the second side of the substrate.

16. The method of claim 15, further comprising:
forming a metal shielding layer over the second side of the substrate, wherein the metal shielding layer is over a black level correction region of the substrate, and wherein an outermost edge of the black level correction region is vertically aligned with a sidewall of a photo diode.

17. The method of claim 16, wherein:
the interconnect layer comprises a metal line, and wherein the metal shielding layer is directly over the metal line.

18. The method of claim 16, further comprising:
forming a plurality of metal grids over the plurality of photo diodes, wherein a thickness of the plurality of metal grids is equal to a thickness of the metal shielding layer.

19. The method of claim 15, wherein:
two adjacent photo diodes of the plurality of photo diodes are separated by an isolation region.

20. The method of claim 15, wherein:
the substrate is thinned to a thickness in a range from about 3 micrometers to about 4 micrometers.

* * * * *